US010727394B1

(12) United States Patent
Bulsara et al.

(10) Patent No.: US 10,727,394 B1
(45) Date of Patent: Jul. 28, 2020

(54) NON-LINEAR BI-STABLE BUCKLED BEAM ENERGY HARVESTER USING REPULSIVE MAGNETIC FORCE FOR ASYMMETRY COMPENSATION

(71) Applicant: THE UNITED STATES OF AMERICA AS REPRESENTED BY THE SECRETARY OF THE NAVY, San Diego, CA (US)

(72) Inventors: Adi R. Bulsara, San Diego, CA (US); Bruno Ando, Catania (IT); Salvatore Baglio, Catania (IT); Vincenzo Marletta, Catania (IT); Antonio Pistorio, Catania (IT)

(73) Assignee: United States of America as represented by Secretary of the Navy, Washington, DC (US)

( * ) Notice: Subject to any disclaimer, the term of this patent is extended or adjusted under 35 U.S.C. 154(b) by 588 days.

(21) Appl. No.: 15/695,815

(22) Filed: Sep. 5, 2017

(51) Int. Cl.
*F03G 7/08* (2006.01)
*H01F 7/02* (2006.01)
*H01F 1/053* (2006.01)
*H01L 41/113* (2006.01)
*H02N 2/18* (2006.01)

(52) U.S. Cl.
CPC ............ *H01L 41/1134* (2013.01); *F03G 7/08* (2013.01); *H01F 1/053* (2013.01); *H01F 7/02* (2013.01); *H02N 2/186* (2013.01)

(58) Field of Classification Search
CPC ........ H01L 41/1134; H02N 2/186; F03G 7/08
See application file for complete search history.

(56) References Cited

U.S. PATENT DOCUMENTS 10,224,835 B1 * 3/2019 Singh ..................... H02N 2/186
2007/0114890 A1 * 5/2007 Churchill ............... H02N 2/188
310/339
2016/0294308 A1 * 10/2016 Chen ........................ H02N 2/18

OTHER PUBLICATIONS

S. Roundy, P. Wright, and J. Rabaey, A study of low level vibrations as a power source for wireless sensor nodes, Computer Communications, vol. 26, No. 11, pp. 1131-1144, 2003.

(Continued)

*Primary Examiner* — Thomas M Dougherty
*Assistant Examiner* — Karen B Addison
(74) *Attorney, Agent, or Firm* — Naval Information Warfare Center, Pacific; Kyle Eppele; Ryan J. Friedl

(57) ABSTRACT

A system that may be used for energy harvesting includes a flexible beam secured between a first support and a second support. The supports are spaced apart at a distance less than a length of the flexible beam such that the beam is buckled. Responsive to external vibrations the flexible beam switches between a first position and a second position. A magnetic proof mass is coupled to the flexible beam at the beam's midpoint. At least one permanent magnet is positioned proximate to the magnetic proof mass and has the same polarity. The permanent magnet is positioned to expose the magnetic proof mass to a repulsive force when the magnetic proof mass is located at both the first position and the second position. Piezoelectric transducers are located above and below the first and second positions of the flexible beam to harvest energy.

20 Claims, 3 Drawing Sheets

(56) References Cited

OTHER PUBLICATIONS

D. Zhu, M. J. Tudor and S. P. Beeby, Strategies for increasing the operating frequency range of vibration energy harvesters: a review, (Topical Review), Meas. Sci. Technol. vol. 21, No. 2, 2010.
S. Baglio, A. R. Bulsara, B. Andò, S. La Malfa, V. Marletta, C. Trigona, P. Longhini, A. Kho, V. In, J. D. Neff, G. W. Anderson, C. C. Obra, B. K. Meadows, A. Palacios, Exploiting Nonlinear Dynamics in Novel Measurement Strategies and Devices: From Theory to Experiments and Applications, IEEE Transactions on Instrumentation and Measurement, 60 (3), pp. 667-695, 2011.
B. Andò, S. Baglio, V. Marletta, A. R. Bulsara, A nonlinear electric field sensor that exploits coupled oscillator dynamics: The charge collection mechanism, IEEE Transactions on Instrumentation and Measurement, 62 (5), pp. 1326-1333, 2013.
R L Harne, K W Wang, A review of the recent research on vibration energy harvesting via bistable systems, 2013 Smart Mater. Struct. 22 023001.
B. Andò, S. Baglio, A. R. Bulsara, V. Marletta, I. Medico, S. Medico, "A double piezo—snap through buckling device for energy harvesting", IEEE 17th International Conference on Solid-State Sensors, Actuators and Microsystems (Transducers & Eurosensors XXVII), pp. 43-45, Jun. 16-20, 2013.
B. Andò, S. Baglio, A. R. Bulsara, V. Marletta, "A bistable buckled beam based approach for vibrational energy harvesting", Sensors and Actuators A: Physical, vol. 211, pp. 153-161, 2013.
B. Andò, S. Baglio, A. R. Bulsara, V. Marletta, V. Ferrari, M. Ferrari, "A Low-Cost Snap-Through Buckling Inkjet Printed Device for Vibrational Energy Harvesting", IEEE Sensors Journal, vol. 15, n. 6, pp. 3209-3220, 2015.
B. Andò, S. Baglio, A. R. Bulsara, V. Marletta, "A Wireless Sensor Node Powered by NonLinear Energy Harvester", IEEE Sensors 2014, Valencia, Spain, Nov. 2-5, 2014.
B. Andò, S. Baglio, A. R. Bulsara, V. Marletta, A. Pistorio, "Experimental and Theoretical Investigation of a Nonlinear Vibrational Energy Harvester", Eurosensors XXIX, Procedia Enginnering 120, pp. 1024-1027, Freiburg, Sep. 6-9, 2015.
B. Andò, S. Baglio, A. R. Buisara, V. Marletta, A. Pistorio, "Performance Investigation of a Nonlinear Vibrational Energy Harvester with Band Limited Noise", Proc. of the IEEE Instrumentation and Measurement Technology Conference, I2MTC 2016, Taipei, Taiwan, May 23-26, 2016.
K. Ylli, D. Hoffmann, A. Willmann, P. Becker, B. Folkmer, Y. Manoli, Energy harvesting from human motion: exploiting swing and shock excitations, Smart Mater. Struct. 24 (2015) 025029 (12 pp).
B. Ando, et al., "All inkjet printed system for strain measurement", IEEE Sensors, pp. 215-217, 2011.
M. Ferrari, et al., "Improved Energy Harvesting from Wideband Vibrations by Non-linear Piezoelectric Converters", Procedia Chemistry, vol. 1, No. 1, pp. 1203-1206, 2009.
D. Brunelli et al., "Design of a Solar-Harvesting Circuit for Batteryless Embedded Systems", Circuits and Systems I: Regular Papers, IEEE Trans. on, vol. 56, No. 11, pp. 2519-2528, 2009.
S. Dalola et al., "Characterization of Thermoelectric Modules for Powering Autonomous Sensors", Instrumentation and Measurement, IEEE Transactions on, vol. 58, No. 1, pp. 99-107, 2009.
P. Thurein, et al., "Custom IC for Ultralow Power RF Energy Scavenging", Power Electronics, IEEE Trans. on, vol. 36, No. 6, pp. 1620-1626.
S. Beeby, et al., "Energy harvesting vibration sources for microsystems applications", Measurement Science technology, vol. 17, No. 12, pp. 175-195, 2006.
B. Ando, et al., Investigation on Mechanically Bistable MEMS Devices for Energy Harvesting From Vibrations, IEEE Journal of Microelectromechanical Systems, vol. 21, No. 4, pp. 779-790, 2012.

\* cited by examiner

NON-LINEAR BI-STABLE BUCKLED BEAM ENERGY HARVESTER USING REPULSIVE MAGNETIC FORCE FOR ASYMMETRY COMPENSATION

FEDERALLY SPONSORED RESEARCH AND DEVELOPMENT

This invention is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 105462.

BACKGROUND

Recent progress in low power electronics and sensors, as well as suitable electronics for power harvesting, makes possible new ideas to scavenge energy from different sources. In particular, environmental mechanical vibration sources have gained much attention because of their ubiquity and the availability of new high-performance materials that can be used to convert mechanical vibrations to a suitable electrical response. Linear resonant mechanical structures, typically based on resonant structures (like for example cantilever beams) and exploiting piezoelectric, macro-fiber composites, electromagnetic or electrostatic conversion mechanisms are able to efficiently harvest energy when it is concentrated very close to their resonance frequency. However, ambient mechanical vibrations come in a large variety of forms such as induced oscillations, seismic noise, vehicle motion, acoustic noise, multi-tone vibrating systems, and, more generally, noisy environments. Occasionally, the energy to be collected may be confined to a very specific region of the frequency spectrum, but very often, however, the available (for harvesting) energy is distributed over a wide frequency spectrum, and resonant energy harvesters lose their effectiveness.

Different solutions, for increasing the operational bandwidth of linear harvesters have been proposed. Most of these solutions, however, present disadvantages including increased complexity, decrease in the power generated, the need for extra systems and energy, low efficiency, as well as difficulty in implementation. On the other hand, the exploitation of new harvesting configurations based on non-linear mechanisms, such as bi-stable systems, has the potential to outperform traditional (linear) energy harvesters under the right set of operating conditions.

DETAILED DESCRIPTION OF SOME EMBODIMENTS

Figure 1:
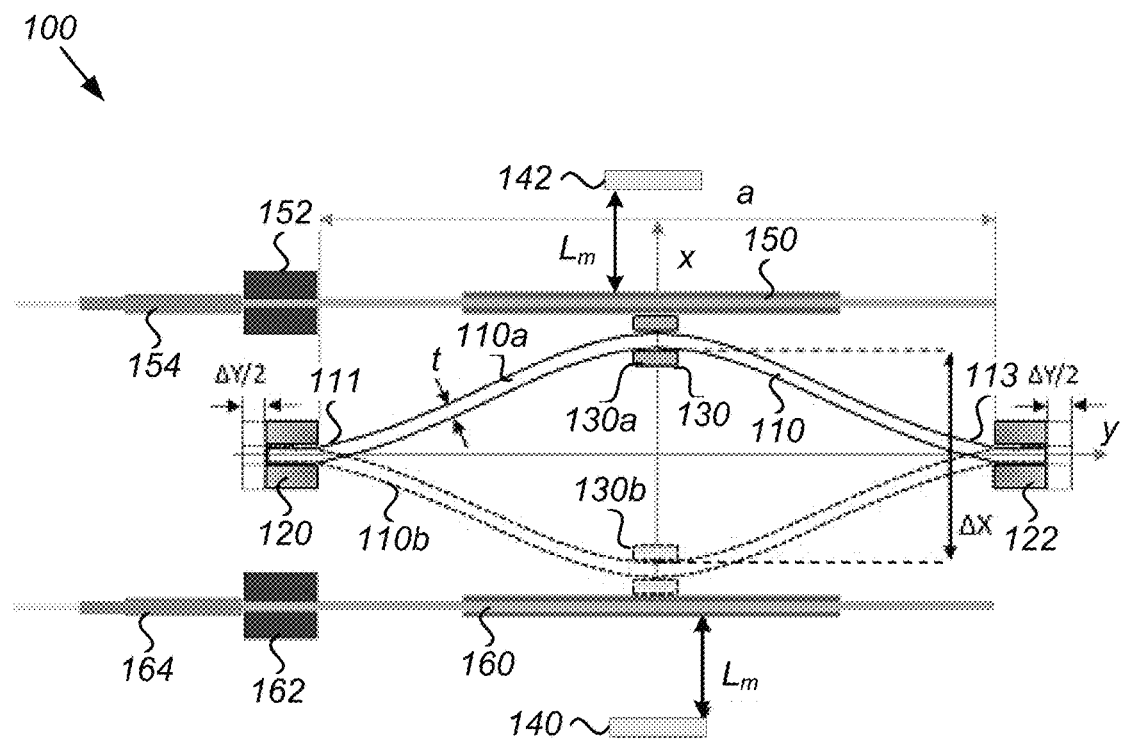
FIG. 1 shows a side view of an embodiment of a system in accordance with the embodiments disclosed herein.

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The disclosed embodiments involve a system that compensates for the asymmetry introduced by the gravity force on the proof mass of a non-linear bi-stable energy harvester. The system exploits the magnetic repulsive force between a permanent magnet placed underneath the bi-stable beam support at a convenient distance and the magnetic proof mass. The system is demonstrated, after the asymmetry compensation, to be capable of scavenging energy from vibrations along the vertical direction, in the range 0.5-10 Hz. The disclosed system is able to generate enough power to, for example, power a wireless node.

One configuration for implementing a non-linear Energy Harvester (EH) is the Snap Through Buckling (STB) structure. Using the STB structure and accelerations from a horizontal position (i.e. in-plane), the minimum acceleration required to switch the beam from one stable state to the other is the same independently from the stable state. This condition cannot be met when the device is operated in vertical position. In fact, the gravity force acting on the proof mass introduces an asymmetry on the accelerations required to switch the beam between the two states (up and bottom). Further, if the proof mass weight is higher than the static force required to switch the beam, the STB beam is observed to become mono-stable, with the lower state being the only stable state.

To compensate for the asymmetry introduced by the gravity force when the beam is in a vertical position, a magnetic repulsive force is provided between a permanent magnet and the proof mass (magnetic). To this aim a permanent magnet is placed underneath the bi-stable beam support at a convenient distance. The system is demonstrated, after the asymmetry compensation, to be capable of scavenging energy from band limited vibration sources in the range 0.5-10 Hz. The bandwidth of the system, also in case it is used along the vertical direction, is compatible with applications where the vibrations occur at low frequencies e.g. in the case of a running human. The system can generate power up to 100 µW in case of an impulsive input acceleration at 4 Hz and 120 µW at 5 Hz; the power increases with the frequency and is sufficient to operate a standard wireless sensor node.

The advantages of the proposed system reside in the simplicity of the solution which avoids the need for more complex geometries of the harvester or of the setup. Moreover, the proposed system enables for readily tuning the effect of compensation. Such a benefit may be useful in certain situations (e.g. in case of an already present magnetic field in the environment or in the case of very low vibrations) where it is desirable to place the permanent magnet in a way to produce on the device a small asymmetry with the aim to reduce the minimum acceleration required to switch the STB beam.

Concerning the advantages of the proposed system it should be considered that they stem, mainly, from the intrinsic non-linear nature of the conversion process. The bi-stable dynamics, implemented by the buckled beam, allow for rapid switching (between the two stable states of the bi-stable configuration) and large displacements, both of which are crucial to enhancing the efficiency of the power conversion process. Moreover, the bi-stable dynamics yields enhanced device behavior in terms of an extension of the frequency band within which the device is able to scavenge energy from vibrations.

It should be highlighted that the availability of an energy harvesting system with a wide frequency bandwidth, ranging from very low frequency (in the order of 0.5 Hz) up to 10 Hz, is important for a number of real applications involving energy scavenging from human actions (mainly motion); these are some of the primary intended applications addressed by the embodiments of the system disclosed herein.

FIG. 1 shows a side view of an embodiment of a system 100 in accordance with the embodiments disclosed herein. System 100 includes a flexible beam 110 secured between a first support 120 and a second support 122. A first end 111 of the flexible beam is secured to the first support 120 and a second end 113 of the flexible beam 110 is secured to the second support 122. First support 120 and second support 122 are spaced apart at a distance less than a length of flexible beam 110 such that flexible beam 110 is buckled, i.e. a pre-compression is placed along the y-axis. Flexible beam 110 may have pre-compressions of, as an example, 1 mm and 3 mm imposed thereon. Using such values, flexible beam 110 will have a displacement from they axis (as shown in FIG. 1) of ±7.95 mm and ±12.9 mm, respectively. It should be noted, however, that the displacement values depend (apart from the pre-compression) on the length of the beam. As an example, if the length of the beam is 6 cm, the pre-compression is 1 mm and the distance between the two stable states is more or less 8 mm (±4 mm). Responsive to external vibrations the flexible beam switches between a first position 110a shown by the solid lines and a second position 110b shown by the dashed lines.

In some embodiments, first support 120 and second support 122 are each movable to a distance of $$\frac{\Delta y}{2}$$

to adjust the pre-compression placed on flexible beam 110. Changing the pre-compression on flexible beam 110 affects the switching dynamics, e.g. the average switching rate, of the system. In some embodiments, the pre-compression $\Delta Y$ on flexible beam 110 is set to 1 mm. However, it should be recognized that other values for $\Delta Y$ may be used depending upon the particular configuration and system design.

Figure 2:
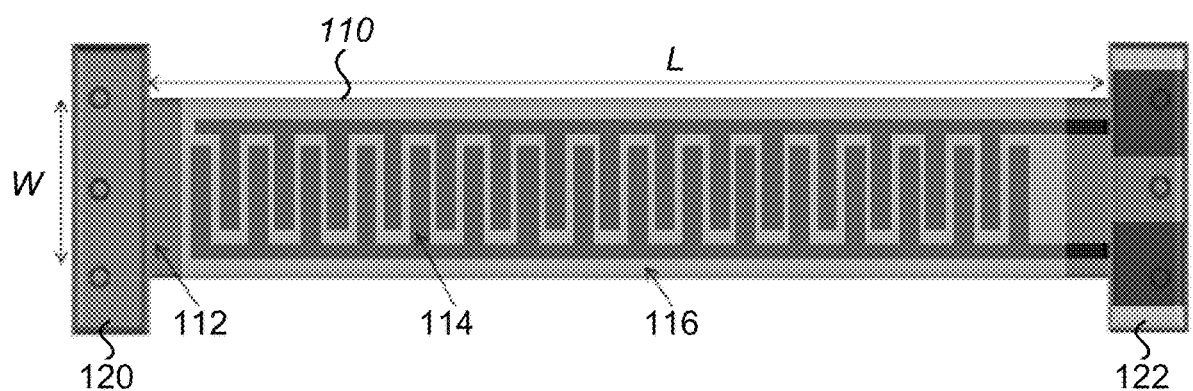
FIG. 2 shows a top-down view of an embodiment of a beam that may be used in accordance with the embodiments disclosed herein.

In some embodiments, flexible beam 110 comprises a substrate 112 having interdigited (IDT) electrodes 114 disposed thereon, as is shown in FIG. 2. As an example, substrate 112 is comprised of polyethylene terephthalate (PET). However it should be recognized that other flexible materials may be used for flexible beam 110. PET having a thickness of 0.1 mm serves as a desirable substrate as it has properties including a mass density of 1390 kg/m$^3$, a Poisson ratio of 0.30, and a tensile strength of 60 MPa.

As an example, IDT electrodes 114 may be realized by inkjet printing a conductive pattern of a silver nano-particle solution (Metalon JS-B15P by Novacentrix), through a commercial inkjet printer. In some embodiments, the IDT electrode fingers may have a width, length and thickness of about 140 µm, 6 mm and 200 nm, respectively, while the track spacing may be about 150 µm.

The length L and width W and thickness of flexible beam 110 may be designed to be various dimensions depending upon size constraints and system application. As a non-limiting example, flexible beam 110 has a length of about 9 cm, a width of about 1 cm, and a thickness of about 100 µm. As another example, flexible beam 110 has a length of about 6 cm, a width of about 1 cm, and a thickness of about 140 µm. In some embodiments, flexible beam 110 further includes a lead zirconate titanate (PZT) layer 116 disposed on top of electrodes 114. Strains stemming from switching flexible beam 110 between first position 110a and second position 110b are converted into an output voltage by PZT layer 116. An increase in the distance $\Delta X$ between the stable positions of flexible beam 110 leads to an increase in both the output voltage and the force amplitude required for switching. IDT electrodes 114 make electrical contact with PZT layer 116.

As an example, PZT layer 116 may be screen printed and may have a thickness of about 25 µm. After deposition of PZT layer 116, it is poled by applying an electrical field of about 2 MV/m at a temperature of about 100° C. for 10 minutes. Poling is the process that induces piezoelectric properties in the PZT ceramic. Before poling the ceramic element has no overall polarization (the direction of polarization among neighboring domains is random). The domains can be aligned by exposing the PZT ceramic to a strong, DC electric field, usually at a temperature below the Curie point. When the electric field is removed most of the dipoles are aligned and the ceramic has a permanent polarization (also known as remnant polarization). The orientation of the DC poling field determines the orientation of the electrical axes. Due to the electrode geometry and the poling direction, the piezoelectric element works predominantly in the mode 33.

In the configuration shown in FIG. 1, flexible beam 110 exhibits a bi-stable behavior when a stress is applied perpendicularly to its surface. In case the input stimulus exceeds the switching threshold, which is mainly defined by the pre-compression as well as the beam material and geometry, flexible beam 110 will start switching between its stable positions, first position 110a and second position 110b. In case of a sub-threshold signal, flexible beam 110 will vibrate close to one of the two stable states. This behavior is well described and ruled by a two-stable-state potential, whose characteristics (the energy barrier height as well as the locations of the stable minima of the potential), are a function of the pre-compression.

The upper and lower stable equilibrium positions are separated by a distance X. An increase of ΔY results in an increase of ΔX. In order to achieve switching events between these stable states, a force F having amplitude larger than a threshold (imposed by the energy barrier inherent in the bi-stability) must be applied in the out-of-plane direction of the beam. The force F is generated by external vibrations and it increases as the beam mass increases. The total mass of the system can be increased by additive proof masses. In order to observe the bi-stability, the following condition between the thickness of flexible beam 110 and the separation (arising from the beam pre-compression) between the stable states should be fulfilled:

$$Q = \frac{\Delta X/2}{t} > 2.31 \quad \text{(Eq. 1)}$$

A magnetic proof mass 130 is coupled to flexible beam 110 at a midpoint of flexible beam 110. Magnetic proof mass 130 is located at a first position 130a when flexible beam 110 is at first position 110a and is located at a second position 130b when flexible beam 110 is at second position 110b. Magnetic proof mass 130 has a first polarity. As an example, a proof mass 130 of 4.77 g is used to optimize the trade-off between the operative frequency band and the minimum force that allows the switching. In some embodiments, magnetic proof mass 130 comprises two identical disk-shaped permanent magnets S-10-04-N with a diameter of 10 mm and a height of 4 mm. The permanent magnets of proof mass 130 may have an axial direction of magnetization.

A permanent magnet 140 is positioned beneath magnetic proof mass 130. Permanent magnet 140 has a second polarity, which is the same as the first polarity of magnetic proof mass 130. Permanent magnet 140 is positioned to expose magnetic proof mass 130 to a repulsive force when magnetic proof mass 130 is located at both the first position 130a and the second position 130b. As an example, permanent magnet 140 is placed underneath the bottom of second piezoelectric transducer 160 at a distance $L_m$=21 mm. In such a position, the distance between permanent magnet 140 and the distance of magnetic proof mass 130 when it is in the stable first position 130a is about 29 mm.

In some embodiments, permanent magnet 140 is a neodymium permanent magnet Q-10-10-01-N. In other embodiments, permanent magnet 140 may comprise other magnetic materials as would be recognized by a person having ordinary skill in the art. In some embodiments, permanent magnet 140 has a direction of magnetization that is parallel to a height of the permanent magnet 140. As an example, permanent magnet 140 has a block shape with dimensions of 10 mm×10 mm×1 mm±0.1 mm.

In some embodiments, a second permanent magnet 142 is positioned above magnetic proof mass 130. Permanent magnet 142 also has a second polarity, which is the same as the first polarity of magnetic proof mass 130. Permanent magnet 142 is positioned to expose magnetic proof mass 130 to a repulsive force when magnetic proof mass 130 is located at both the first position 130a and the second position 130b, but more so when located at first position 130a. As an example, permanent magnet 142 is placed above the top of first piezoelectric transducer 150 at a distance $L_m$=21 mm. In such position, the distance between permanent magnet 142 and the distance of magnetic proof mass 130 when it is in the second position 130b is about 29 mm. As an example, permanent magnet 142 is a neodymium permanent magnet Q-10-10-01-N.

The use of both first permanent magnet 140 and second permanent magnet 142 helps to ensure as many changes between the first position 130a and the second position 130b as possible, especially in situations where the system is oriented about 90 degrees from the position shown in FIG. 1 or in positions that are angled at an orientation less than about 90 degrees from the position shown in FIG. 1.

A first piezoelectric transducer 150 is positioned above flexible beam 110 at a distance such that when flexible beam 110 is at the first position 110a magnetic proof mass 130 is in contact with first piezoelectric transducer 150. First piezoelectric transducer 150 is connected to a clamp 152 which is connected to piezoelectric transducer connector 154. A second piezoelectric transducer 160 is positioned below flexible beam 110 at a distance such that when flexible beam 110 is at second position 110b magnetic proof mass 130 is in contact with second piezoelectric transducer 160. Second piezoelectric transducer 160 is also positioned above permanent magnet 140. First piezoelectric transducer 150 is configured the same as second piezoelectric transducer 160. Second piezoelectric transducer 160 is connected to a clamp 162 which is connected to piezoelectric transducer connector 164.

Examples of first piezoelectric transducer 150 and second piezoelectric transducer 160 are manufactured by Midè (model Volture V21BL) and are ultra-thin and light weight devices which convert the beam impacts (in each steady state) into electric charges. As an example, the dimensions of the piezoelectric transducers are 9.04 cm by 1.68 cm, while the thickness is 0.8 mm. The piezoelectric transducers are attached at only one end to improve the efficiency of the energy conversion mechanism. In particular, such choice allows for increasing the beam deflection and vibrations at their natural frequency (110 Hz) as a consequence of the proof mass impacts. As an example, the distance between the first and second piezoelectric transducers 150 and 160 may about 8 mm, which roughly corresponds to the distance, Δx, between the two stable positions of flexible beam 110.

The behavior of a lab prototype of system 100 has been experimentally investigated by a dedicated setup whose main component is a shaker, consisting of a movable platform actuated by a vibration exciter and controlled by a power amplifier. The vibration exciter and the power amplifier are the TV 51110 and the BAA 120 manufactured by TIRA GmbH, respectively. The STB has been fixed on the movable platform of the vibration exciter. A reference accelerometer, model MMA7331L by Freescale Semiconductor, with a nominal sensitivity S=83.6 mV/g (configured in the operating range of ±12 g), has been also included in order to perform an independent measurement of the input signal. Moreover, a distance measurement module, model QTR-1A by Pololu, including a very small reflectance InfraRed (IR) sensor and the conditioning electronics, has been embedded in the STB architecture to continuously monitor the displacement of the proof mass. To avoid the effects of exogenous quantities on the IR sensor, the STB harvester has been enclosed in a plastic box (12×12×6) cm.

Test signals have been generated by the 33120A function generator by Agilent Technologies, while output signals from the piezoelectric transducers, the reflectance infrared sensor, and the reference accelerometer have been acquired by the MSO9064A scope by Agilent Technologies, with a sampling frequency fs=4 kHz, saved and processed by dedicated Matlab paradigms.

In order to assess the proposed strategy for the compensation of the asymmetry introduced by the gravity force, in case the device is used to scavenge energy from vertical vibrations, and to investigate the dynamic behavior of the device, several repeated cycles of mechanical stimulation were applied by the dedicated experimental setup.

The experiments were aimed at estimating the response of the bi-stable system by observing the number of complete switches of the beam between its constrained stable states with and without the repulsive magnet. The shaker was driven in voltage mode by a periodic square signal, which forced a pulse acceleration stimulus to the STB harvester. The signal frequency range was 0.5-10 Hz.

Figure 3:
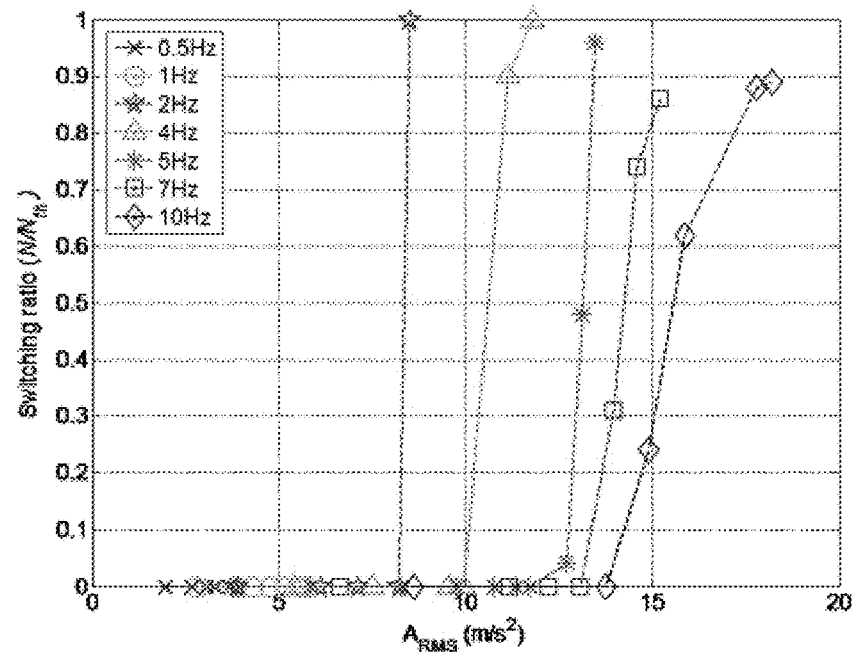
FIG. 3 shows a graph illustrating a normalized number of complete switches versus root mean square (RMS) acceleration without a repulsive magnet beneath the harvester.
Figure 4:
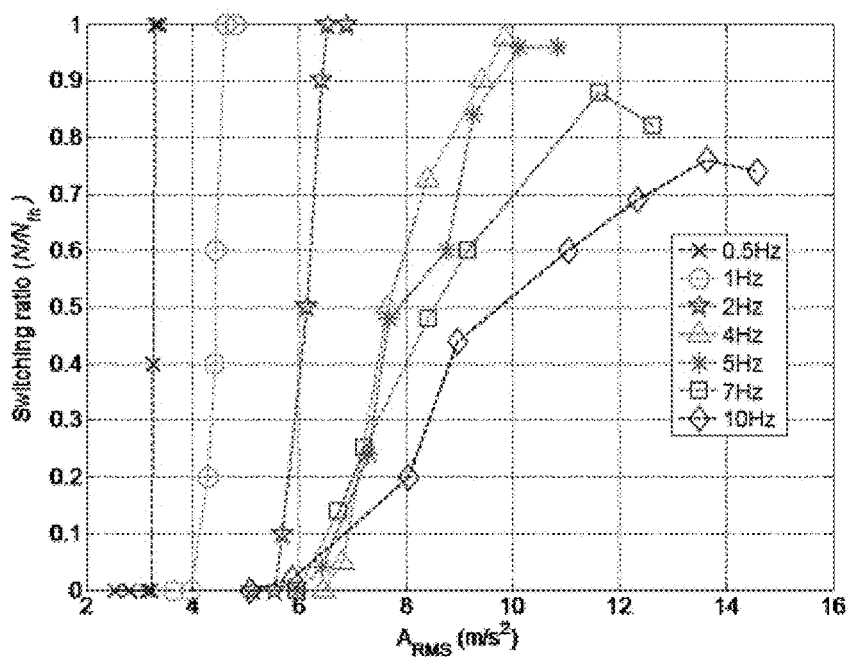
FIG. 4 shows a graph illustrating a normalized number of complete switches versus RMS acceleration with a repulsive magnet beneath the harvester.

Referring to FIGS. 3 and 4, FIG. 3 shows a graph 200 illustrating a normalized number ($N/N_{th}$) of complete switches versus root mean square (RMS) acceleration without a repulsive magnet beneath the harvester and FIG. 4 shows a graph 300 illustrating a normalized number ($N/N_{th}$) of complete switches versus RMS acceleration with a repulsive magnet beneath the harvester, with both graphs showing the frequency range 0.5-10 Hz. Here, Nth represents the expected theoretical number of switches while N is the observed number of switches.

As shown in the graphs, the normalized number of switches increases with the acceleration and decreases with the frequency. Graphs 200 and 300 provide information about the bandwidth of the system, i.e. the range of frequencies in which the beam can follow the signal dynamics (i.e. the switching rate corresponds to the stimulation frequency). It is clear that the bandwidth of the system extends up to about 4 Hz, but the STB beam can be exploited up to higher frequencies (10 Hz) in case of higher input accelerations, with an acceptable loss of efficiency.

Figure 5:
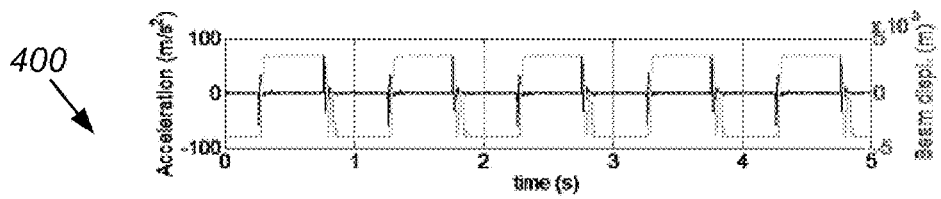
FIGS. 5-7 show graphs illustrating measured acceleration and displacement of the beam between two stable states and output voltage from the piezoelectric transducers with a repulsive magnet beneath the harvester.
Figure 6:
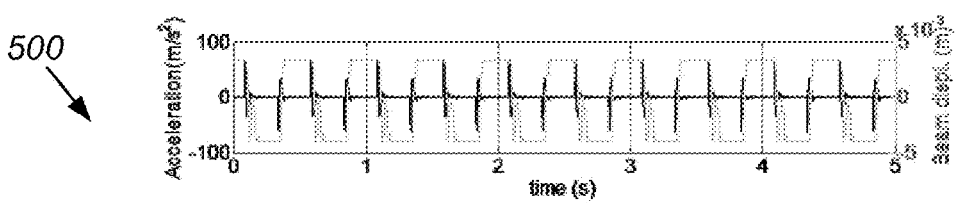
Figure 7:
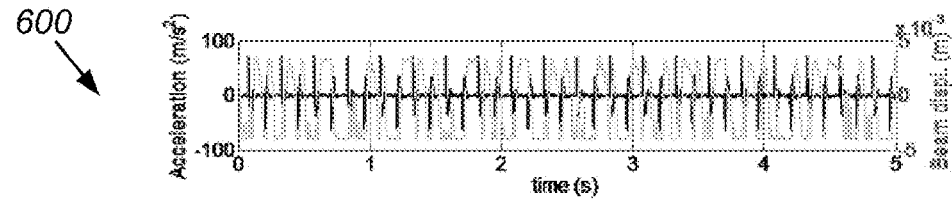

FIGS. 5-7 show graphs illustrating measured acceleration and displacement of the beam between two stable states and output voltage from the piezoelectric transducers with a repulsive magnet beneath the harvester. FIG. 5 shows a graph 400 with $Acc_{max}$=71.1 m/s² at 1 Hz, FIG. 6 shows a graph 500 with $Acc_{max}$=71.25 m/s² at 2 Hz, and FIG. 7 shows a graph 600 with $Acc_{max}$=80.4 m/s² at 4 Hz.

The first evident information arising from FIGS. 5-7 is that the repulsive magnet makes the beam switching between its two stable states at lower frequencies and acceleration values where the device without the repulsive magnet behaves like a mono-stable system (the beam resides in its lower state). Moreover, the amplitude of the piezoelectric output voltages increases in cases the beam switches between its stable states and hit the transducers. It should be observed that the impact of the proof mass on the upper piezoelectric transducers is, however, less strong than the impact on the lower piezo thus producing a lower output voltage.

The electrical power for increasing frequencies of the impulsive stimulus in the range 0.5-10 Hz was evaluated as $P_e=V_{RMS}^2/R$, where R=15 kΩ is the resistive load assuring the optimal power transfer. As an example, the amount of power generated by the developed prototype system is about 100 µW with a input RMS acceleration of 9.85 m/s² at 4 Hz, and 120 µW with a input RMS acceleration of 10.1 m/s² at 5 Hz.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

We claim:

1. A system comprising:
   a flexible beam secured between a first support and a second support, wherein a first end of the flexible beam is secured to the first support and a second end of the flexible beam is secured to the second support, wherein the first support and the second support are spaced apart at a distance less than a length of the flexible beam such that the flexible beam is buckled, wherein responsive to external vibrations the flexible beam switches between a first position and a second position;
   a magnetic proof mass coupled to the flexible beam at a midpoint of the flexible beam, wherein magnetic proof mass has a first polarity; and
   at least one permanent magnet positioned in proximity to the magnetic proof mass, wherein the permanent magnet has a second polarity, wherein the first polarity is the same as the second polarity, wherein the permanent magnet is positioned to expose the magnetic proof mass to a repulsive force when the magnetic proof mass is located at both the first position and the second position.

2. The system of claim 1 further comprising:
   a first piezoelectric transducer positioned above the flexible beam at a distance such that when the flexible beam is at the first position the magnetic proof mass is in contact with the first piezoelectric transducer; and
   a second piezoelectric transducer positioned below the flexible beam at a distance such that when the flexible beam is at the second position the magnetic proof mass is in contact with the second piezoelectric transducer.

3. The system of claim 2, wherein the at least one permanent magnet comprises a first permanent magnet positioned below the second piezoelectric transducer and a second permanent magnet positioned above the first piezoelectric transducer.

4. The system of claim 1, wherein the proof mass comprises two disk-shaped permanent magnets having an axial direction of magnetization.

5. The system of claim 1, wherein the flexible beam comprises a substrate having interdigited (IDT) electrodes disposed thereon.

6. The system of claim 5, wherein substrate is comprised of polyethylene terephthalate.

7. The system of claim 5, further comprising a lead zirconate titanate (PZT) layer disposed on top of the IDT electrodes.

8. The system of claim 1, wherein the permanent magnet is comprised of neodymium.

9. The system of claim 1, wherein the permanent magnet has a direction of magnetization that is parallel to a height of the permanent magnet.

10. A system comprising:
    a flexible beam secured between a first support and a second support, wherein a first end of the flexible beam is secured to the first support and a second end of the flexible beam is secured to the second support, wherein the first support and the second support are spaced apart at a distance less than a length of the flexible beam such that the flexible beam is buckled, wherein responsive to external vibrations the flexible beam switches between a first position and a second position;
- a magnetic proof mass coupled to the flexible beam at a midpoint of the flexible beam, wherein magnetic proof mass has a first polarity, wherein the proof mass comprises two disk-shaped permanent magnets having an axial direction of magnetization;
- at least one permanent magnet positioned in proximity to the magnetic proof mass, wherein the permanent magnet has a second polarity, wherein the first polarity is the same as the second polarity, wherein the permanent magnet is positioned to expose the magnetic proof mass to a repulsive force when the magnetic proof mass is located at both the first position and the second position, wherein the permanent magnet has a direction of magnetization that is parallel to a height of the permanent magnet;
- a first piezoelectric transducer positioned above the flexible beam at a distance such that when the flexible beam is at the first position the magnetic proof mass is in contact with the first piezoelectric transducer; and
- a second piezoelectric transducer positioned below the flexible beam at a distance such that when the flexible beam is at the second position the magnetic proof mass is in contact with the second piezoelectric transducer.

11. The system of claim 10, wherein the flexible beam comprises a substrate having interdigited (IDT) electrodes disposed thereon.

12. The system of claim 11, wherein substrate is comprised of polyethylene terephthalate.

13. The system of claim 11, further comprising a lead zirconate titanate (PZT) layer disposed on top of the IDT electrodes.

14. The system of claim 10, wherein the permanent magnet is comprised of neodymium.

15. A system comprising:
- a flexible beam secured between a first support and a second support, wherein a first end of the flexible beam is secured to the first support and a second end of the flexible beam is secured to the second support, wherein the first support and the second support are spaced apart at a distance less than a length of the flexible beam such that the flexible beam is buckled, wherein responsive to external vibrations the flexible beam switches between a first position and a second position, wherein the flexible beam comprises a substrate having interdigited (IDT) electrodes disposed thereon;
- a magnetic proof mass coupled to the flexible beam at a midpoint of the flexible beam, wherein magnetic proof mass has a first polarity;
- a first permanent magnet positioned beneath the magnetic proof mass and a second permanent magnet positioned above the magnetic proof mass, wherein the first permanent magnet and the second permanent magnet have a second polarity, wherein the first polarity is the same as the second polarity, wherein the first permanent magnet and the second permanent magnet are positioned to expose the magnetic proof mass to a repulsive force when the magnetic proof mass is located at both the first position and the second position;
- a first piezoelectric transducer positioned above the flexible beam at a distance such that when the flexible beam is at the first position the magnetic proof mass is in contact with the first piezoelectric transducer; and
- a second piezoelectric transducer positioned below the flexible beam at a distance such that when the flexible beam is at the second position the magnetic proof mass is in contact with the second piezoelectric transducer.

16. The system of claim 15, wherein the proof mass comprises two disk-shaped permanent magnets having an axial direction of magnetization.

17. The system of claim 15, wherein the first permanent magnet and the second permanent magnet have a direction of magnetization that is parallel to a height of the permanent magnet.

18. The system of claim 15, wherein substrate is comprised of polyethylene terephthalate.

19. The system of claim 15 further comprising a lead zirconate titanate (PZT) layer disposed on top of the IDT electrodes.

20. The system of claim 15, wherein the first permanent magnet and the second permanent magnet are each comprised of neodymium.

* * * * *